United States Patent
Nishida (10) Patent No.: US 11,385,289 B2
(45) Date of Patent: Jul. 12, 2022

(54) CONTROL DEVICE FOR POWER SUPPLY CIRCUIT

(71) Applicant: TOYOTA JIDOSHA KABUSHIKI KAISHA, Toyota (JP)

(72) Inventor: Hisato Nishida, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 19 days.

(21) Appl. No.: 17/156,747

(22) Filed: Jan. 25, 2021

(65) Prior Publication Data

US 2021/0255245 A1 Aug. 19, 2021

(30) Foreign Application Priority Data

Feb. 19, 2020 (JP) .............................. JP2020-026090

(51) Int. Cl.
*G01R 31/327* (2006.01)

(52) U.S. Cl.
CPC ................................ *G01R 31/3278* (2013.01)

(58) Field of Classification Search
CPC .................................................. G01R 31/3278
See application file for complete search history.

(56) References Cited

U.S. PATENT DOCUMENTS 7,964,985 B2 * 6/2011 Ozaki ..................... B60L 50/16
307/10.1

FOREIGN PATENT DOCUMENTS

| JP | 2012-178895 A | 9/2012 |
| JP | 2017-093057 A | 5/2017 |
| JP | 2020-120526 A | 8/2020 |

* cited by examiner

*Primary Examiner* — Walter L Lindsay, Jr.
*Assistant Examiner* — Milton Gonzalez
(74) *Attorney, Agent, or Firm* — Oliff PLC (57) ABSTRACT

A control device that controls a power supply circuit including a battery, a first relay, and a second relay performs: a sequence process of turning on the second relay after turning on the first relay; a process of measuring an elapsed time until a voltage of a load starts increasing after the second relay has been turned on by performing the sequence process; and a process of determining that the second relay has deteriorated when determination conditions including a condition that the elapsed time is equal to or greater than a prescribed determination value are satisfied.

3 Claims, 6 Drawing Sheets

CONTROL DEVICE FOR POWER SUPPLY CIRCUIT

CROSS-REFERENCE TO RELATED APPLICATION

This application claims priority to Japanese Patent Application No. 2020-026090 filed on Feb. 19, 2020, incorporated herein by reference in its entirety.

BACKGROUND

1. Technical Field

The present disclosure relates to a control device for a power supply circuit.

2. Description of Related Art

For example, in a device described in Japanese Unexamined Patent Publication No. 2012-178895 (JP 2012-178895 A), a plurality of relays is provided in a power supply circuit which is connected to a load. In such relays, an abnormality in which some relays are inoperative due to welding of contacts may occur. In the device described in JP 2012-178895 A, an inoperative abnormality of a relay is detected based on whether a voltage on the load side changes when the relay is turned on.

SUMMARY

Since abrasion powder due to sliding accumulates in a movable portion of a movable contact of a deteriorated relay, an operation speed of the movable contact decreases with deterioration of the relay. In this way, in a deteriorated relay, an operation delay time until the movable contact comes into contact with a fixed contact, that is, until the contacts are closed, after the relay has been turned on, increases, but the relay itself is in an operative state. Accordingly, by determining whether the relay is inoperative, it is not possible to determine whether a relay has deteriorated.

According to an aspect of the present disclosure, there is provided a control device for a power supply circuit including a battery and a plurality of relays. The power supply circuit further includes a first relay that is connected between one of a positive electrode and a negative electrode of the battery and a load and a second relay that is connected between the other of the positive electrode and the negative electrode of the battery and the load. The control device performs: a process of acquiring one of a current flowing in the power supply circuit and a voltage of the load as a monitored value; a sequence process of turning on the second relay after turning on the first relay; a process of measuring an elapsed time until the monitored value starts increasing after the second relay has been turned on by performing the sequence process; and a process of determining that the second relay has deteriorated when determination conditions including a condition that the elapsed time is equal to or greater than a prescribed determination value are satisfied.

Since abrasion powder due to sliding accumulates in a movable portion of a movable contact of a relay, an operation speed of the movable contact decreases with deterioration of the relay. Accordingly, in a deteriorated relay, a time until the movable contact comes into contact with a fixed contact, that is, a time until the contacts are closed, after the relay has been turned on, tends to increase. When an operation delay time of such a relay increases, a time until a current flowing in the power supply circuit starts increasing after the relay has been turned on or a time until a voltage of a load starts increasing after the relay has been turned on, increases.

Therefore, with this configuration, one of the current flowing in the power supply circuit and the voltage of the load is acquired as a monitored value, and it is determined that the second relay has deteriorated when the determination conditions including the condition that the elapsed time until the monitored value starts increasing after the second relay has been turned on is equal to or greater than the prescribed determination value are satisfied. Accordingly, it is possible to appropriately determine whether the second relay has deteriorated.

In the control device for a power supply circuit, the determination conditions may include a condition that the elapsed time is equal to or greater than the determination value and that the elapsed time being equal to or greater than the determination value has been continuously determined a prescribed number of times.

Even in a relay which has not deteriorated, when foreign matter is temporarily attached to the movable portion of the movable contact, there is a likelihood that the elapsed time will be equal to or greater than the determination value. Since temporarily attached foreign matter is often removed due to movement of the movable contact, there are few cases in which the elapsed time continuously becomes equal to or greater than the determination value. Therefore, in this configuration, when the elapsed time being equal to or greater than the prescribed determination value is continuously determined a prescribed number of times or more in addition to the condition that the elapsed time is equal to or greater than the determination value, it is determined that the second relay has deteriorated. Accordingly, it is possible to prevent a temporary inoperative abnormality of the second relay from being erroneously determined to be deterioration of the second relay.

In the control device for a power supply circuit, the determination conditions may include a condition that the elapsed time is equal to or greater than the determination value and the elapsed time when the second relay has been turned on has an increasing trend.

Even in a relay which has not deteriorated, as described above, when foreign matter is temporarily attached to the movable portion of the movable contact, there is a likelihood that the elapsed time will be equal to or greater than the determination value. Since temporarily attached foreign matter is often removed due to movement of the movable contact, it is unlikely that the elapsed time will have an increasing trend when the second relay is turned on. Therefore, in this configuration, when the elapsed time when the second relay is turned on tends to increase in addition to the condition that the elapsed time is equal to or greater than the determination value, it is determined that the second relay has deteriorated. Accordingly, with this configuration, it is possible to prevent a temporary inoperative abnormality of the second relay from being erroneously determined to be deterioration of the second relay.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein.

DETAILED DESCRIPTION OF EMBODIMENTS

First Embodiment

Hereinafter, a first embodiment of a control device for a power supply circuit which is applied to a vehicle including an electric motor as a drive source such as a hybrid vehicle or an electric vehicle will be described with reference to FIGS. 1 to 4.

Figure 1:
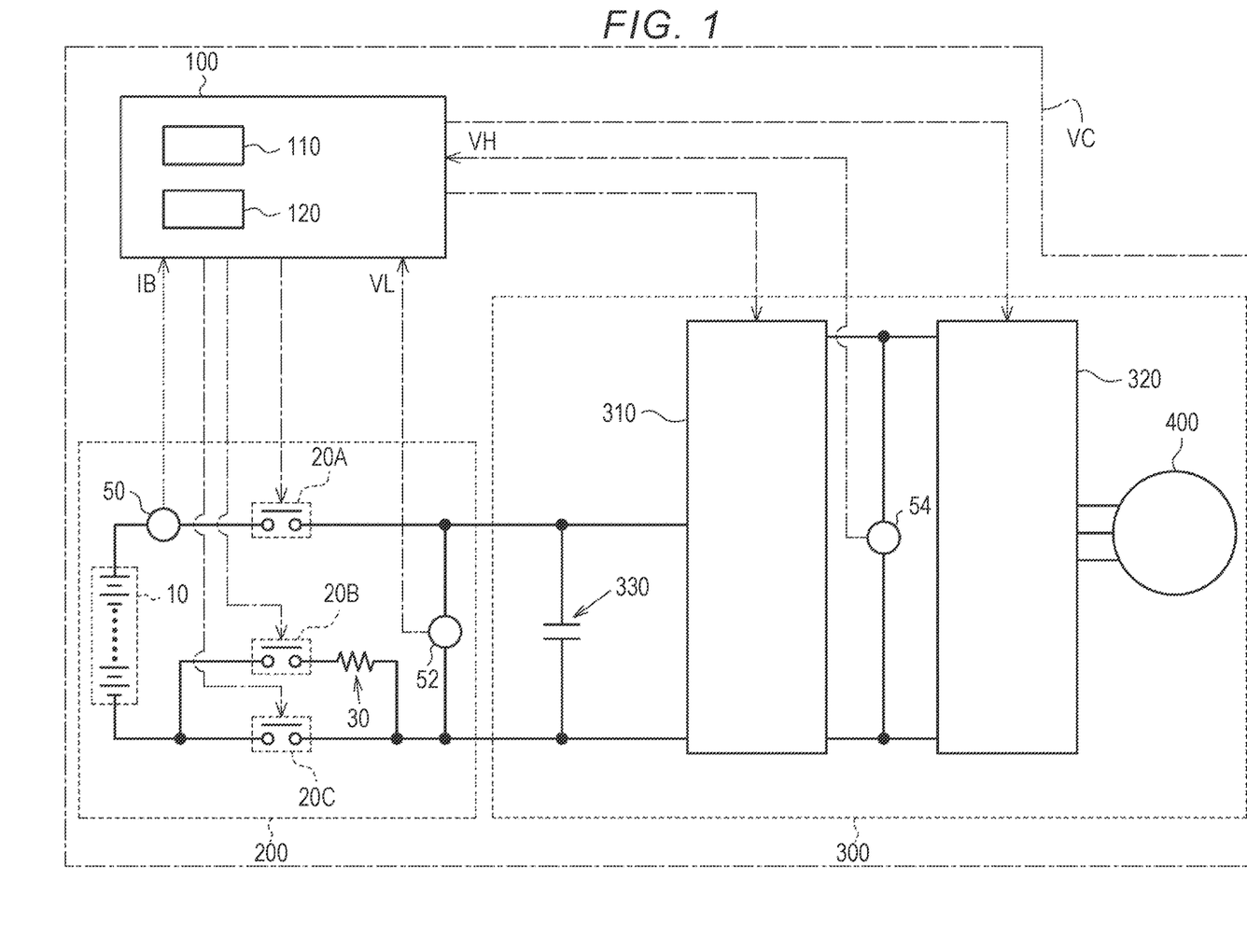
FIG. 1 is a diagram schematically illustrating a power supply circuit and a control device therefor according to a first embodiment.

As illustrated in FIG. 1, a power supply circuit 200, an electrical load 300 (hereinafter referred to as a load 300) that is supplied with electric power from the power supply circuit 200, and a control device 100 that controls the power supply circuit 200 and the load 300 are mounted in a vehicle VC.

The power supply circuit 200 includes a battery for vehicle traveling 10, a first relay 20A, a second relay 20B, a third relay 20C, a resistor 30, a current detector 50, and a first voltage detector 52. The first relay 20A, the second relay 20B, and the third relay 20C are relays in which a movable contact comes into contact with a fixed contact to close the contacts by exciting a coil which is provided therein when the relays are turned on.

The first relay 20A is connected between a positive electrode of the battery 10 and the load 300. The second relay 20B is connected between a negative electrode of the battery 10 and the load 300. The resistor 30 is connected in series to the second relay 20B.

The third relay 20C is connected in parallel to the second relay 20B and the resistor 30. The current detector 50 is provided on the positive electrode side of the battery 10 and detects a current IB flowing in the power supply circuit 200.

The first voltage detector 52 detects a voltage of the load 300, more specifically, a first voltage VL which is a voltage supplied from the battery 10 to the load 300. The load 300 includes a converter 310 that is connected to the battery 10 via the relays, an inverter 320 that is supplied with electric power of which a voltage has been stepped up by the converter 310, and an electric motor 400 that is connected to the inverter 320 and serves as a drive source of the vehicle VC. The number of electric motors that are connected to the inverter 320 can be appropriately changed. The load 300 further includes a capacitor 330 that is connected in parallel to the converter 310 and smooths electric power supplied from the battery 10 to the converter 310 and a second voltage detector 54 that detects a second voltage VH which is a voltage of electric power supplied from the converter 310 to the inverter 320. In addition, the second voltage VH which is detected by the second voltage detector 54 when the converter 310 and the inverter 320 are in an inactivated state immediately after supply of electric power from the power supply circuit 200 to the load 300 has been started is the same as the voltage of electric power supplied from the battery 10 to the load 300.

The control device 100 includes a central processing unit (hereinafter referred to as a CPU) 110 and a memory 120 in which a control program or data is stored. The control device 100 performs processes associated with various types of control by causing the CPU 110 to execute a program stored in the memory 120.

The current IB, the first voltage VL, and the second voltage VH are input to the control device 100. The control device 100 controls an activation state of the electric motor 400 by controlling turning-on and turning-off of the first relay 20A, the second relay 20B, and the third relay 20C and controlling operation states of the converter 310 and the inverter 320.

The control device 100 performs a starting sequence process which will be described below on the relays when supply of electric power from the battery 10 to the load 300 is started by turning on an ignition switch of the vehicle VC. The converter 310 and the inverter 320 are in an inoperative state while the sequence process is being performed.

Figure 2A:
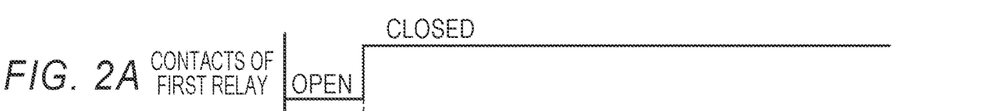
FIG. 2A is a timing chart illustrating a contact state of a first relay when relays are sequentially turned on in the first embodiment.

FIGS. 2A to 2F illustrate contact states of the relays which change with a process of the starting sequence process and change of the current IB, the first voltage VL, and the second voltage VH. When the sequence process is started, the control device 100 first electrically connects the positive electrode of the battery 10 to the load 300 by turning on the first relay 20A to close the contacts as illustrated in FIG. 2A (time t1).

Figure 2B:
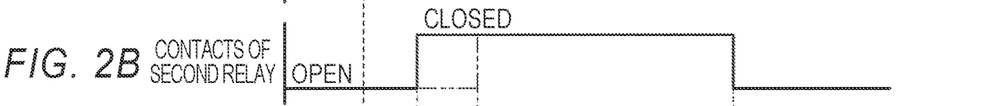
FIG. 2B is a timing chart illustrating a contact state of a second relay when the relays are sequentially turned on in the first embodiment.

Then, the control device 100 electrically connects the negative electrode of the battery 10 to the load 300 by turning on the second relay 20B to close the contacts as illustrated in FIG. 2B (time t2). Accordingly, since supply of electric power from the battery 10 to the load 300 is started, the current IB, the first voltage VL, and the second voltage VH which were "0" up to that time starts increasing to a battery voltage BT which is the voltage of the battery 10 as illustrated in FIGS. 2D, 2E, and 2F. Here, since supply of electric power from the battery 10 to the load 300 via the resistor 30 is performed at that time, an inrush current at the time of starting supply of electric power to the load 300 is decreased.

Figure 2C:
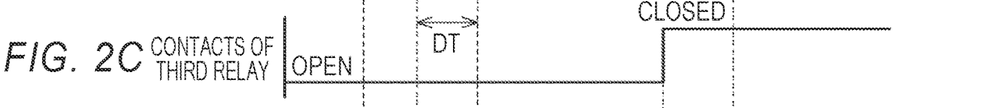
FIG. 2C is a timing chart illustrating a contact state of a third relay when the relays are sequentially turned on in the first embodiment.
Figure 2D:
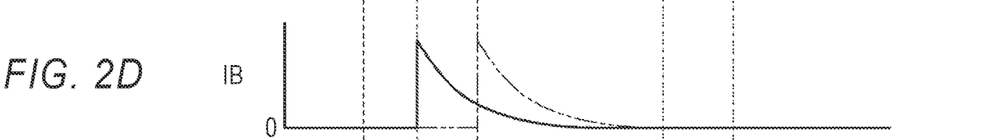
FIG. 2D is a timing chart illustrating change of a current when the relays are sequentially turned on in the first embodiment.
Figure 2E:
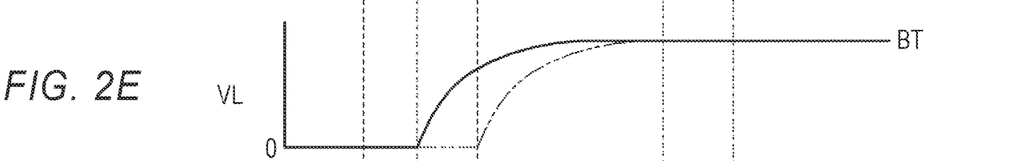
FIG. 2E is a timing chart illustrating change of a first voltage when the relays are sequentially turned on in the first embodiment.
Figure 2F:
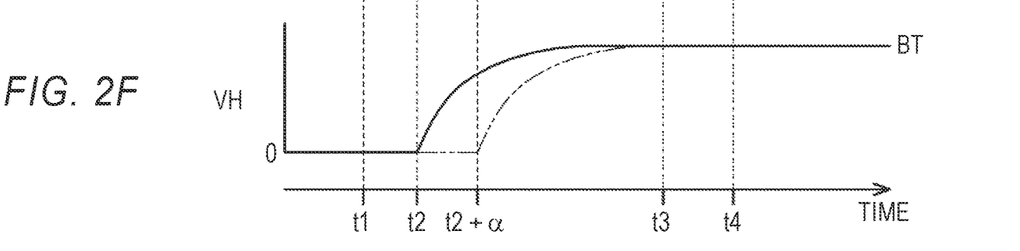
FIG. 2F is a timing chart illustrating change of a second voltage when the relays are sequentially turned on in the first embodiment.

Then, the control device 100 electrically connects the negative electrode of the battery 10 to the load 300 via the third relay 20C and the second relay 20B by turning on the third relay 20C to close the contacts as illustrated in FIG. 2C (time t3).

Then, the control device 100 electrically connects the negative electrode of the battery 10 to the load 300 without passing through the resistor 30 by turning off the second relay 20B to open the contacts as illustrated in FIG. 2B. Then, the starting sequence process ends (time t4).

Since abrasion powder due to sliding accumulates in the movable portion of the movable contact of the second relay 20B, an operation speed of the movable contact decreases with deterioration of the second relay 20B. Accordingly, as indicated by an alternate long and two short dash line in FIGS. 2B, 2D, 2E, and 2F, in the second relay 20B which has deteriorated, a time until the movable contact comes into contact with the fixed contact, that is, a time DT until the contacts are closed, after the second relay 20B has been turned on, tends to increase. When an operation delay time of the second relay 20B increases, a time until the current IB flowing in the power supply circuit 200 after the second relay 20B has been turned on starts increasing (a time from time t2 to time t2+α in FIGS. 2A to 2F) increases. Similarly, a time until the voltage of the load 300, that is, the first voltage VL or the second voltage VH, starts increasing after the second relay 20B has been turned on (a time from time t2 to time t2+α in FIGS. 2A to 2F) also increases.

Therefore, in this embodiment, the first voltage VL which is the voltage of the load 300 is acquired as a monitored value. Whether the second relay 20B has deteriorated and whether a symptom of failure has appeared in the second relay 20B are determined based on the elapsed time T until the first voltage VL which is the monitored value starts increasing after the second relay 20B has been turned on.

Figure 3:
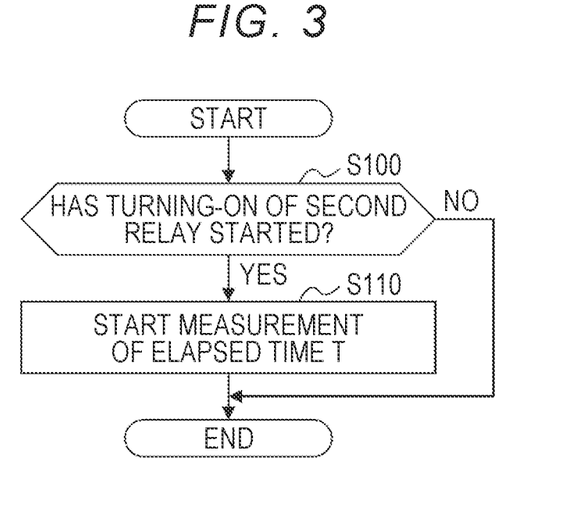
FIG. 3 is a flowchart illustrating a process routine which is performed by the control device according to the first embodiment.

Processes which are performed to perform such determination by the control device 100 will be described below with reference to FIGS. 3 and 4. FIG. 3 illustrates a process routine which is performed to start measurement of the elapsed time T by the control device 100. This process routine is repeatedly performed until measurement of the elapsed T is started after an ignition switch has been turned on. In the following description, a step number is represented by a numeral prefixed by "S."

When this process routine is started, the control device 100 determines whether turning-on of the second relay 20B has been started through the sequence process (S100). When it is determined that turning-on of the second relay 20B has been started (S100: NO), the control device 100 starts measurement of the elapsed time T (S110) and ends the process routine.

On the other hand, when it is determined in S100 that turning-on of the second relay 20B has not been started (S100: NO), the control device 100 temporarily ends the process routine without performing the process of S110.

Figure 4:
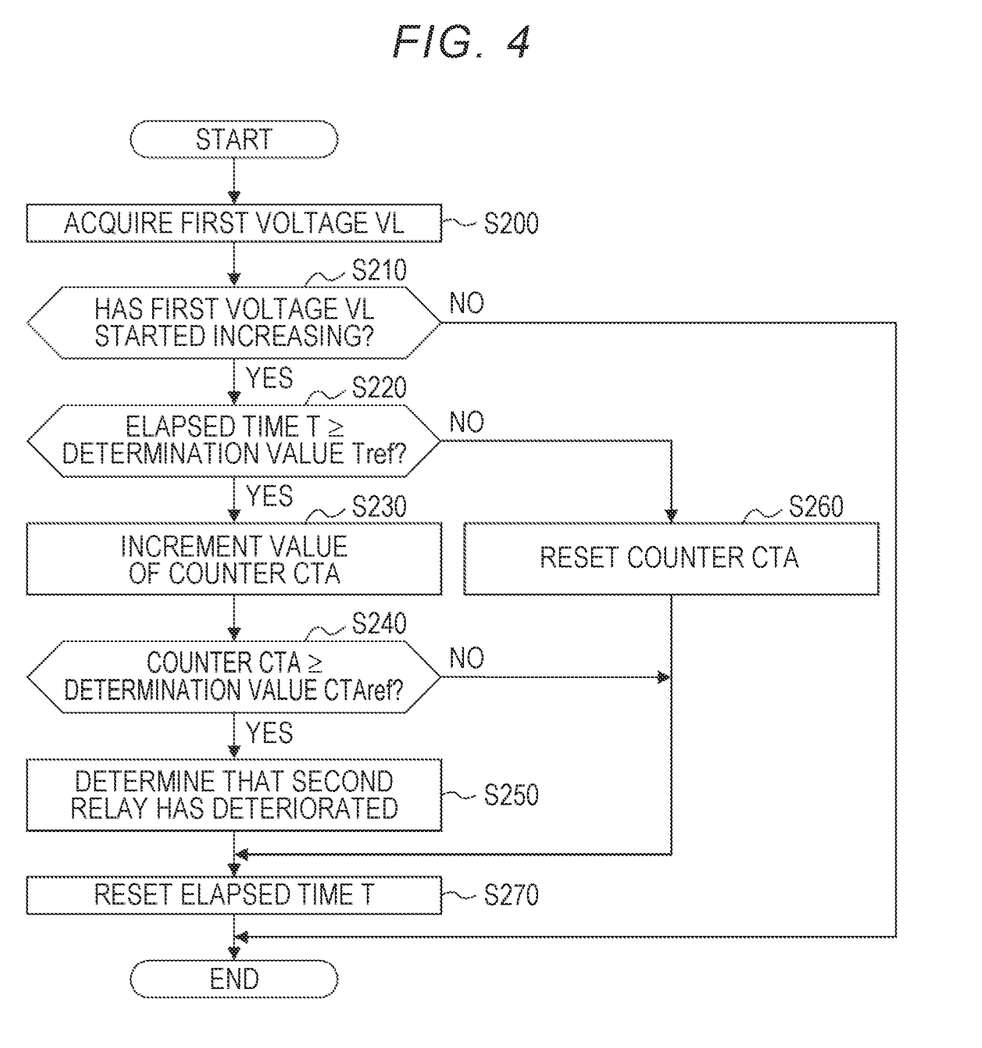
FIG. 4 is a flowchart illustrating a routine of a determination process which is performed by the control device according to the first embodiment.

FIG. 4 illustrates a process routine of a determination process to determine whether the second relay 20B has deteriorated which is performed by the control device 100. This process routine is repeatedly performed while the elapsed time T is being measured.

When this process routine is started, the control device 100 acquires the first voltage VL (S200). Then, the control device 100 determines whether the first voltage VL has started increasing after the second relay 20B has been turned on (S210). When it is determined that the acquired first voltage VL has not started increasing (S210: NO), the control device 100 temporarily ends the process routine.

On the other hand, when it is determined that the acquired first voltage VL has started increasing (S210: YES), the control device 100 determines whether the measured current elapsed time T, that is, the elapsed time T until the first voltage VL starts increasing after the second relay 20B has been turned on, is equal to or greater than a prescribed determination value Tref (S220). A time in which it can be determined that the second relay 20B has deteriorated based on the elapsed time T until the first voltage VL starts increasing after the second relay 20B has been turned on being equal to or greater than the determination value Tref is set as the determination value Tref in advance.

When it is determined that the current elapsed time T is equal to or greater than the determination value Tref (S220: YES), the control device 100 increments the value of a counter CTA (S230). The counter CTA is a value indicating the number of times the elapsed time T until the first voltage VL starts increasing after the second relay 20B has been turned on being equal to or greater than the determination value Tref has been continuously determined, and the value is stored in a nonvolatile memory even after the ignition switch has been turned off.

Then, the control device 100 determines whether the incremented counter CTA value is equal to or greater than a prescribed determination value CTAref (S240). A value with which it can be determined that an operation delay of the second relay 20B is not temporary but occurs continuously based on the counter CTA value being equal to or greater than the determination value CTAref is set as the determination value CTAref in advance.

When it is determined that the incremented counter CTA value is equal to or greater than the determination value CTAref (S240: YES), the control device 100 determines that the second relay 20B has deteriorated (S250) and resets the elapsed time T (S270). Then, the process routine ends temporarily.

When it is determined in S220 that the elapsed time T is less than the determination value Tref (S220: NO), the control device 100 resets the counter CTA value to "0" by performing the process of S260, and then performs the process of S270, and then the process routine ends temporarily.

When it is determined in S240 that the incremented counter CTA value is less than the determination value CTAref (S240: NO), the control device 100 resets the elapsed time T without performing the process of S250 (S270). Then, the process routine ends temporarily.

Operations and advantages of this embodiment will be described below.

(1-1) In the determination process routine illustrated in FIG. 4, when the determination conditions including the condition that the elapsed time T until the first voltage VL starts increasing after the second relay 20B has been turned on is equal to or greater than the determination value Tref (S220: YES) are satisfied, it is determined in S250 that the second relay 20B has deteriorated.

Even in a relay which has not deteriorated, when foreign matter is temporarily attached to the movable portion of the movable contact, there is a likelihood that the elapsed time T will be equal to or greater than the determination value Tref. Since temporarily attached foreign matter is often removed due to movement of the movable contact, there are few cases in which the elapsed time T continuously becomes equal to or greater than the determination value Tref.

Therefore, in this embodiment, when the counter CTA is equal to or greater than the determination value CTAref (S240: YES) and the elapsed time T being equal to or greater than the determination value Tref is continuously determined a prescribed number of times or more in addition to the elapsed time T until the first voltage VL starts increasing after the second relay 20B has been turned on being equal to or greater than the determination value Tref (S220: YES), it is determined in S250 that the second relay 20B has deteriorated. Accordingly, it is possible to prevent a temporary inoperative abnormality of the second relay 20B from being erroneously determined to be deterioration of the second relay 20B and to appropriately determine whether the second relay 20B has deteriorated.

Second Embodiment

A control device for a power supply circuit according to a second embodiment will be described below with reference to FIG. 5. In this embodiment, a determination process routine in which some processes illustrated in FIG. 4 in the first embodiment are changed is performed. The determination process routine according to this embodiment will be described below.

Figure 5:
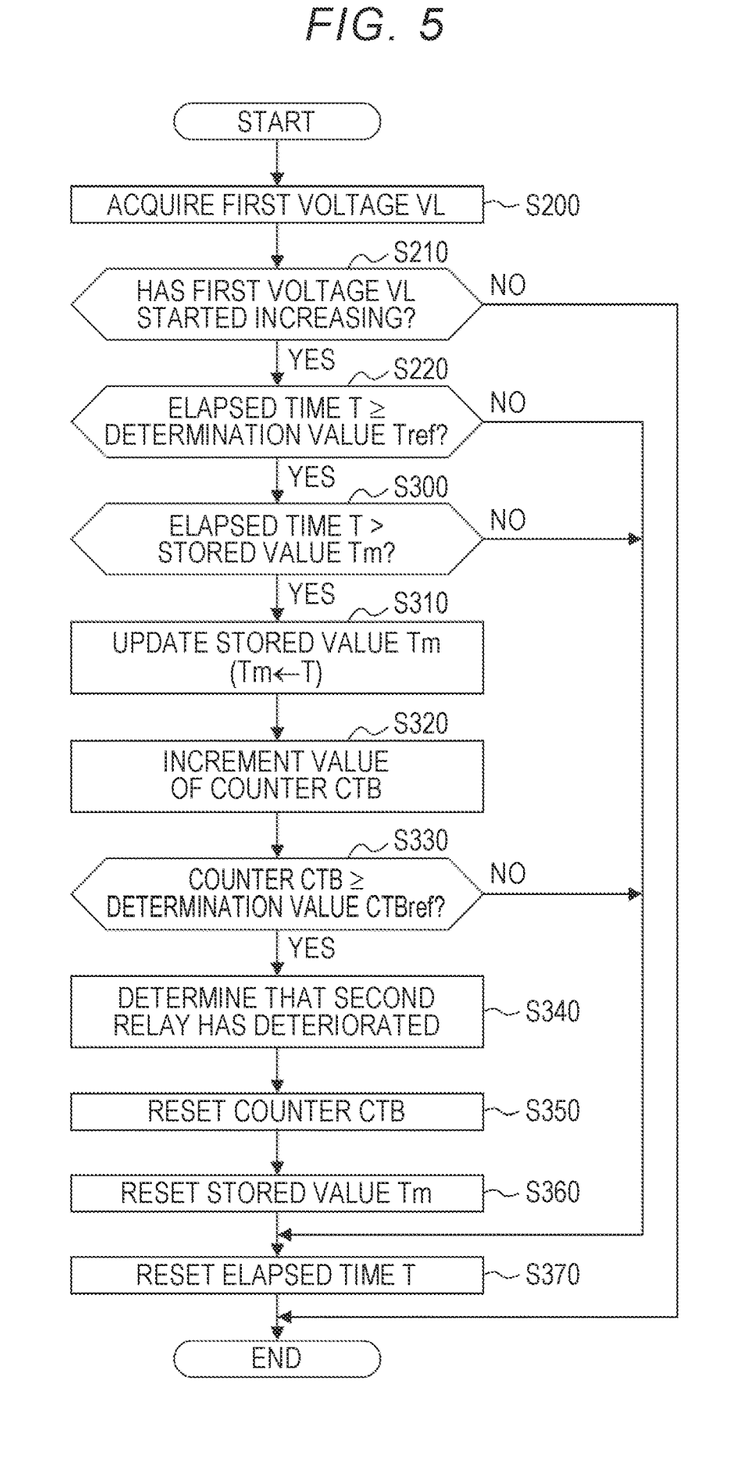
FIG. 5 is a flowchart illustrating a routine of a determination process which is performed by a control device according to a second embodiment.

FIG. 5 illustrates a determination process routine which is performed to determine whether the second relay 20B has deteriorated by the control device 100. When this process routine is started, the control device 100 acquires the first voltage VL (S200).

Then, the control device 100 determines whether the first voltage VL has started increasing after the second relay 20B has been turned on (S210). When it is determined that the acquired first voltage VL has not started increasing (S210: NO), the control device 100 temporarily ends the process routine.

On the other hand, when it is determined that the acquired first voltage VL has started increasing (S210: YES), the control device 100 determines whether the currently measured elapsed time, that is, the elapsed time T until the first voltage VL starts increasing after the second relay 20B has been turned on, is equal to or greater than a prescribed determination value Tref (S220). The determination value Tref is the same as the determination value Tref in the first embodiment.

When it is determined that the current elapsed time T is equal to or greater than the determination value Tref (S220: YES), the control device 100 determines whether the current elapsed time T is greater than a stored value Tm (S300). An initial value of the stored value Tm is "0," and the stored value Tm is updated by setting the elapsed time T as the stored value Tm when the elapsed time T until the first voltage VL starts increasing after the second relay 20B has been turned on is equal to or greater than the stored value Tm.

When it is determined in S300 that the current elapsed time T is greater than the stored value Tm (S300: YES), the control device 100 updates the stored value Tm as described above (S310) and increments the value of a counter CTB (S320). The value of the counter CTB indicates the number of times the stored value Tm has been updated, that is, the number of times it has been determined that the elapsed time T until the first voltage VL starts increasing after the second relay 20B has been turned on is greater than the maximum value of the elapsed time T stored up to that time. A large value of the counter CTB value means that the elapsed time T until the first voltage VL starts increasing after the second relay 20B has been turned on has an increasing trend. The value of the counter CTB is stored in a nonvolatile memory even after the ignition switch has been turned off.

Then, the control device 100 determines whether the incremented counter CTB is equal to or greater than a prescribed determination value CTBref (S330). A value with which it can be determined that the elapsed time T until the first voltage VL starts increasing after the second relay 20B has been turned on has an increasing trend at the time of turning on the second relay 20B based on the counter CTB being equal to or greater than the determination value CTBref is set as the determination value CTBref in advance.

When it is determined that incremented counter CTB is equal to or greater than the determination value CTBref (S330: YES), the control device 100 determines that the second relay 20B has deteriorated (S340). Then, the control device 100 performs a process of resetting the counter CTB to "0" (S350), a process of resetting the stored value Tm (S360), and a process of resetting the elapsed time T (S370) and then temporarily ends the process routine.

When it is determined in S220 that the elapsed time T is less than the determination value Tref (S220: NO), when it is determined in S300 that the elapsed time T is equal to or less than the stored value Tm (S300: NO), or when it is determined in S330 that the counter CTB is less than the determination value CTBref (S330: NO), the control device 100 resets the elapsed time T by performing the process of S370, and then temporarily ends the process routine.

Operations and advantages of this embodiment will be described below.

(2-1) In the determination process routine illustrated in FIG. 5, when the determination conditions including the condition that the elapsed time T until the first voltage VL starts increasing after the second relay 20B has been turned on is equal to or greater than the determination value Tref (S220: YES) are satisfied, it is also determined in S340 that the second relay 20B has deteriorated.

Even in a relay which has not deteriorated, when foreign matter is temporarily attached to the movable portion of the movable contact, there is a likelihood that the elapsed time T will be equal to or greater than the determination value Tref. Since temporarily attached foreign matter is often removed due to movement of the movable contact, there is a low likelihood that the elapsed time T will increase when the second relay 20B is turned on.

Therefore, in this embodiment, when the counter CTB is equal to or greater than the determination value CTBref (S330: YES) and the elapsed time T when the second relay 20B is turned on has an increasing trend in addition to the elapsed time T until the first voltage VL starts increasing after the second relay 20B has been turned on being equal to or greater than the determination value Tref (S220: YES), it is determined in S340 that the second relay 20B has deteriorated. Accordingly, it is possible to prevent a temporary inoperative abnormality of the second relay 20B from being erroneously determined to be deterioration of the second relay 20B and to appropriately determine whether the second relay 20B has deteriorated.

The above embodiments can be modified and embodied as follows. The above embodiments and the following modified examples can be combined and embodied unless a technical conflict arises.

In the first embodiment, when the elapsed time T being equal to or greater than the determination value Tref is continuously determined a prescribed number of times or more in addition to the elapsed time T until the first voltage VL starts increasing after the second relay 20B has been turned on being equal to or greater than the determination value Tref, it is determined that the second relay 20B has deteriorated. More simply, whether the second relay 20B has deteriorated may be determined through a determination process routine illustrated in FIG. 6.

Figure 6:
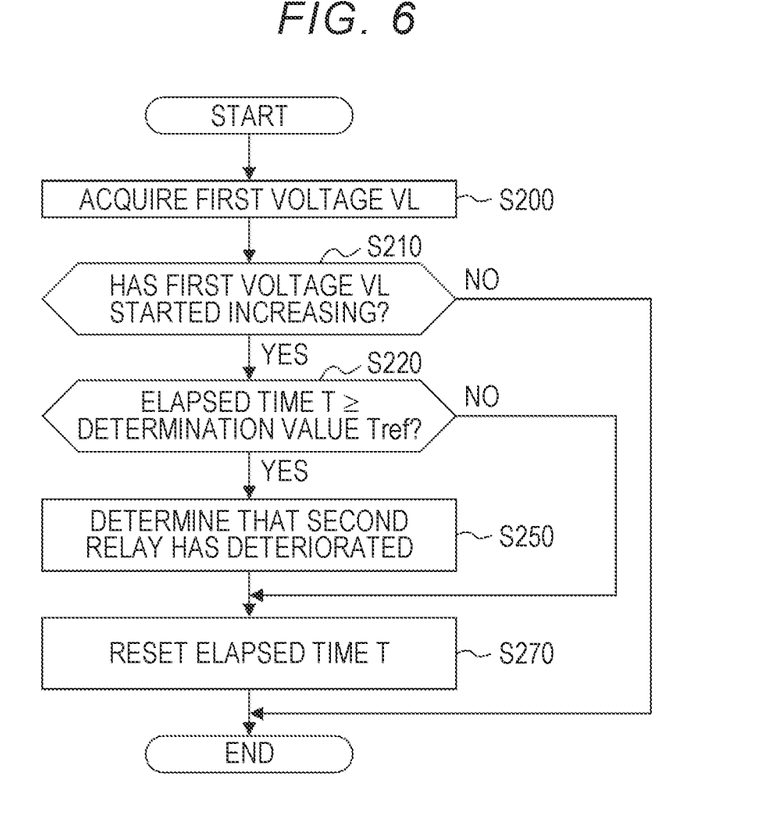
FIG. 6 is a flowchart illustrating a routine of a determination process according to a modified example of the first embodiment.

That is, as illustrated in FIG. 6, when the determination process routine according to the modified example is started, the control device 100 acquires the first voltage VL (S200). Then, the control device 100 determines whether the first voltage VL has started increasing after the second relay 20B has been turned on (S210). When it is determined that the acquired first voltage VL has not started increasing (S210: NO), the control device 100 temporarily ends the process routine.

On the other hand, when it is determined that the acquired first voltage VL has started increasing (S210: YES), the control device 100 determines whether the currently measured elapsed time, that is, the elapsed time T until the first voltage VL starts increasing after the second relay 20B has been turned on, is equal to or greater than a prescribed determination value Tref (S220). The determination value Tref is the same as the determination value Tref in the first embodiment.

When it is determined that the current elapsed time T is equal to or greater than the determination value Tref (S220: YES), the control device 100 determines that the second relay 20B has deteriorated (S250) and resets the elapsed time T (S270). Then, the process routine ends temporarily.

On the other hand, when it is determined in S220 that the elapsed time T is less than the determination value Tref (S220: NO), the control device 100 resets the elapsed time T without performing the process of S250 (S270). Then, the process routine ends temporarily.

In this modified example, when the elapsed time T until the first voltage VL starts increasing after the second relay 20B has been turned on is equal to or greater than the determination value Tref (S220: YES), it is determined in S250 that the second relay 20B has deteriorated and thus it is possible to determine at least whether the second relay 20B has deteriorated.

In the above embodiments or the modified examples, the first voltage VL is employed as the voltage of the load 300, but when the contacts of the second relay 20B are closed, the second voltage VH also starts increasing at the same timing as the first voltage VL as illustrated in FIGS. 2A to 2F. Therefore, the second voltage VH may be employed as the voltage of the load 300.

In the above embodiments or the modified examples, the voltage of the load 300 is employed as the monitored value, but when the contacts of the second relay 20B are closed, the current IB also starts increasing at the same timing as the voltage of the load 300 as illustrated in FIGS. 2A to 2F. Therefore, the current IB may be employed as the monitored value.

Figure 7:
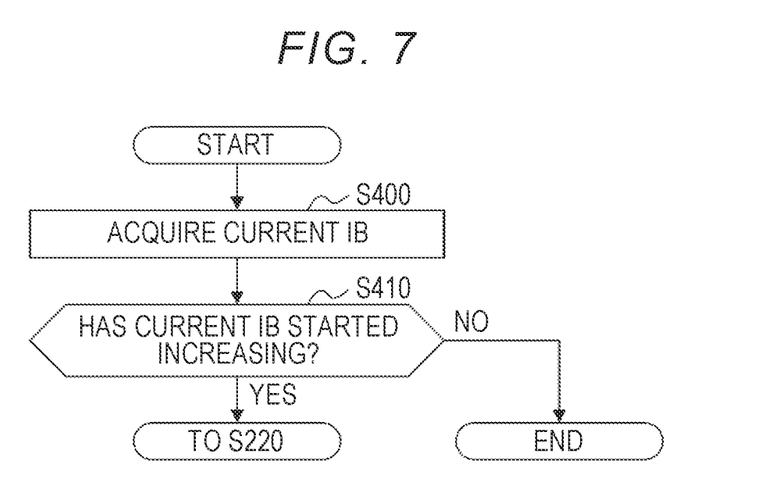
FIG. 7 is a flowchart illustrating a part of a routine of the determination process according to a modification of the embodiments and the modified example.

As illustrated in FIG. 7, in this modified example, the control device 100 performs a process of acquiring the current IB instead of the process of S200 in the determination process routines illustrated in FIGS. 4, 5, and 6 (S400). Then, the control device 100 performs a process of determining whether the current IB has started increasing (S410) instead of the process of S210 of the determination process routines illustrated in FIGS. 4, 5, and 6. When it is determined that the acquired current IB has not started increasing (S410: NO), the control device 100 temporarily ends the determination process routine according to this modified example.

On the other hand, when it is determined that the acquired current IB has started increasing (S410: YES), the control device 100 sequentially performs the processes after S220. In this modified example, operations and advantages similar to those of the above embodiments and the modified examples can be achieved.

The second relay 20B, the resistor 30, and the third relay 20C may be connected to the positive electrode side of the battery 10, and the first relay 20A may be connected to the negative electrode side of the battery 10.

The power supply circuit 200 includes the first relay 20A, the second relay 20B, the third relay 20C, and the resistor 30, but may be a power supply circuit in which the resistor 30 and the third relay 20C are omitted. In this case, it is also possible to determine whether the second relay 20B has deteriorated by performing the above-mentioned processes.

The control device 100 is not limited to the configuration including the CPU 110 and the memory 120 and performing software processes. For example, the control device 100 may include a dedicated hardware circuit (for example, an ASIC) that performs at least some of the software processes which are performed in the above embodiments. That is, the control device 100 has only to have one of the following configurations (a) to (c): (a) A configuration including a processor that performs all the processes in accordance with a program and a program storage device such as a memory that stores the program; (b) A configuration including a processor that performs some of the processes in accordance with a program, a program storage device, and a dedicated hardware circuit that performs the other processes; and (c) A configuration including a dedicated hardware circuit that performs all the processes. Here, the number of software processing circuits including a processor and a program storage device or the number of dedicated hardware circuits may be two or more. That is, the processes have only to be performed by a processing circuit including at least one of one or more software processing circuits and one or more dedicated hardware circuits.

What is claimed is:

1. A control device for a power supply circuit including a battery and a plurality of relays,
    wherein the power supply circuit further includes a first relay that is connected between one of a positive electrode and a negative electrode of the battery and a load and a second relay that is connected between the other of the positive electrode and the negative electrode of the battery and the load, and
    wherein the control device performs:
        a process of acquiring one of a current flowing in the power supply circuit and a voltage of the load as a monitored value;
        a sequence process of turning on the second relay after turning on the first relay;
        a process of measuring an elapsed time until the monitored value starts increasing after the second relay has been turned on by performing the sequence process; and
        a process of determining that the second relay has deteriorated when determination conditions including a condition that the elapsed time is equal to or greater than a prescribed determination value are satisfied.

2. The control device for a power supply circuit according to claim 1, wherein the determination conditions include a condition that the elapsed time is equal to or greater than the determination value and that the elapsed time being equal to or greater than the determination value has been continuously determined a prescribed number of times or more.

3. The control device for a power supply circuit according to claim 1, wherein the determination conditions include a condition that the elapsed time is equal to or greater than the determination value and the elapsed time when the second relay has been turned on has an increasing trend.

* * * * *